US008896065B2

(12) United States Patent
Kisdarjono et al.

(10) Patent No.: US 8,896,065 B2
(45) Date of Patent: Nov. 25, 2014

(54) TOP GATE THIN FILM TRANSISTOR WITH INDEPENDENT FIELD CONTROL FOR OFF-CURRENT SUPPRESSION

(75) Inventors: Hidayat Kisdarjono, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 1721 days.

(21) Appl. No.: 12/102,770

(22) Filed: Apr. 14, 2008

(65) Prior Publication Data

US 2009/0256203 A1    Oct. 15, 2009

(51) Int. Cl.
*H01L 29/786*    (2006.01)
*H01L 29/423*    (2006.01)

(52) U.S. Cl.
CPC .... *H01L 29/78609* (2013.01); *H01L 29/78696* (2013.01); *H01L 29/42384* (2013.01); *H01L 29/78645* (2013.01)
USPC ........ 257/366; 257/66; 257/72; 257/E29.275; 438/157; 438/161

(58) Field of Classification Search
CPC .................... H01L 29/78645; H01L 29/78696
USPC ...................... 257/66, 72, 365–366, E29.275; 438/149, 151, 161, 157–159
See application file for complete search history.

(56) References Cited

U.S. PATENT DOCUMENTS

| 4,733,284 | A | * | 3/1988 | Aoki ............................... 257/59 |
| 4,882,295 | A | * | 11/1989 | Czubatyj et al. .............. 438/158 |
| 5,482,870 | A | | 1/1996 | Inoue |
| 5,757,048 | A | * | 5/1998 | Inoue ........................... 257/344 |
| 5,770,486 | A | | 6/1998 | Zhang et al. |
| 5,900,646 | A | * | 5/1999 | Takizawa et al. ................ 257/57 |
| 6,327,006 | B1 | * | 12/2001 | Sato et al. ....................... 349/44 |
| 7,132,319 | B2 | * | 11/2006 | Hoffman ....................... 438/161 |
| 2009/0224250 | A1 | * | 9/2009 | Kisdarjono et al. ............ 257/66 |

* cited by examiner

*Primary Examiner* — Anh Mai
(74) *Attorney, Agent, or Firm* — Law Office of Gerald Maliszewski; Gerald Maliszewski

(57) ABSTRACT

A bottom-contacted top gate (TG) thin film transistor (TFT) with independent field control for off-current suppression is provided, along with an associated fabrication method. The method provides a substrate, and forms source and drain regions overlying the substrate, each having a channel interface top surface. A channel is interposed between the source and drain, with source and drain contact regions immediately overlying the source/drain (S/D) interface top surfaces, respectively. A first dielectric layer is formed overlying the source, drain, and channel. A first gate is formed overlying the first dielectric, having a drain sidewall located between the contact regions. A second dielectric layer is formed overlying the first gate and first dielectric. A second gate overlies the second dielectric, located over the drain contact region.

18 Claims, 5 Drawing Sheets

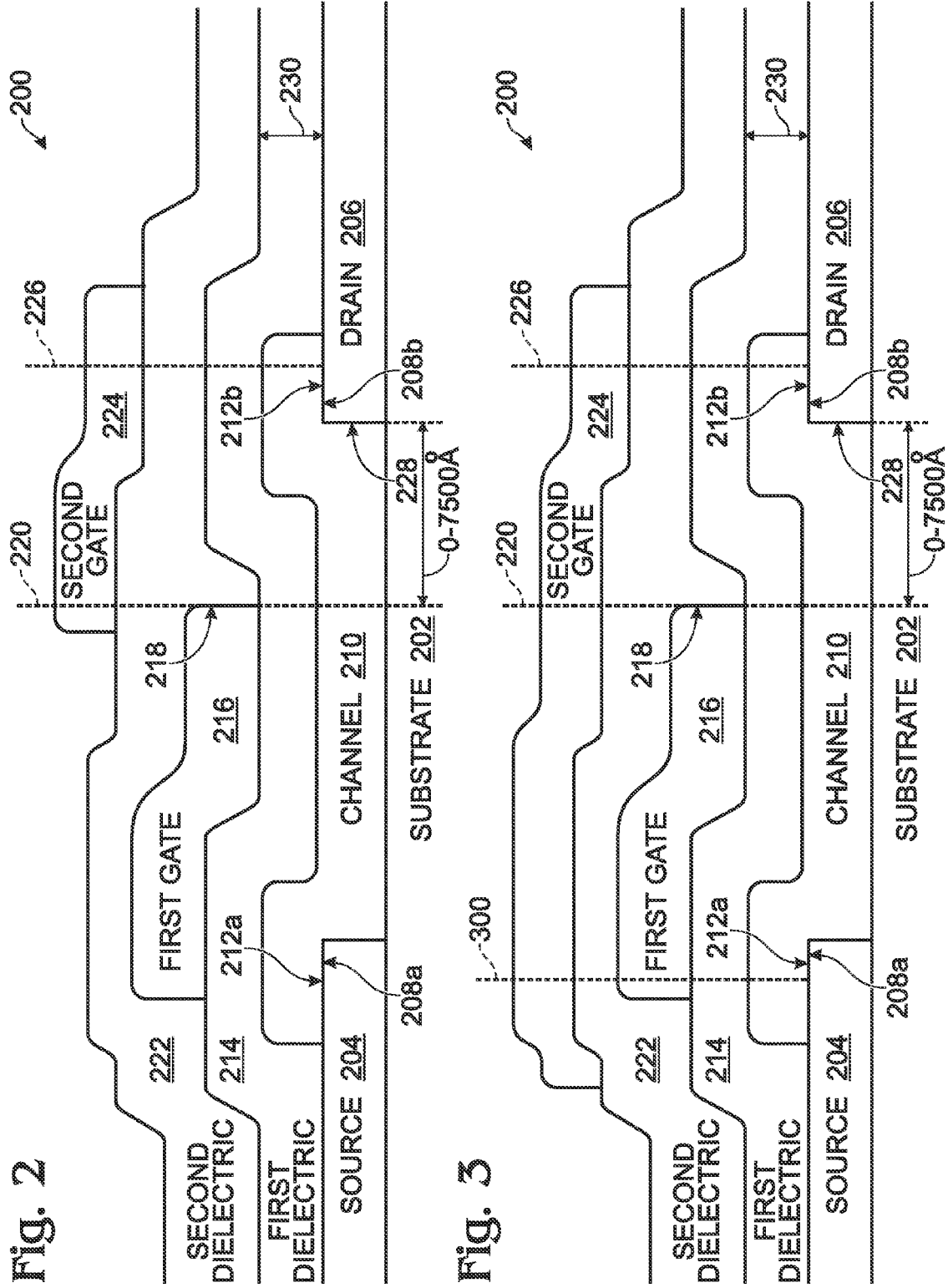

TOP GATE THIN FILM TRANSISTOR WITH INDEPENDENT FIELD CONTROL FOR OFF-CURRENT SUPPRESSION

BACKGROUND OF THE INVENTION

1. Field of the Invention

This invention generally relates to integrated circuit (IC) fabrication and, more particularly, to a two-gate structure that permits enhanced off-current suppression in a top gate thin-film transistor (TFT).

2. Description of the Related Art

FIGS. 1A and 1B are, respectively, partial cross-sectional views of bottom gate and top gate TFT devices made using an amorphous silicon (Si) active layer (prior art). For ease of fabrication using well-established process flows, the channel is formed from a thin-film material that is interposed between the source and drain, while overlapping the regions (contact regions) of the source and drain. Such a structure is optimal for an amorphous Si (a-Si) active layer because the gate/contact overlap ensures low contact resistance without causing high off-current.

To economically fabricate higher quality consumer devices such a liquid crystal display (LCD) televisions, so-called mid-mobility TFTs may be fabricated over glass panel substrates using mid-mobility materials (e.g. microcrystalline silicon ($\mu$c-Si)) as the active layer, in place of more conventional materials such as a-Si. In addition to the higher effective mobility due to better quality active layer, these TFT's are required to have a similar or lower level of off-current. Except for this active layer deposition step, it is desirable that the devices are fabricated using conventional TFT process technology. The use of these mid-mobility devices could provide a technical path to the integration of a variety of circuits and address the so-called system-on-panel concept.

However, the above-described channel contact structure is not necessarily optimal for use with mid-mobility active layers made from $\mu$c-Si. When $\mu$c-Si replaces a-Si as active layer in the conventional structure, operation in the off-state subjects the $\mu$c-Si active layer to very large field. The smaller energy gap, higher mobility, and large defect density in the active film result in off-current levels that are much higher than if a-Si is used. Alternately stated, the simplicity of conventional structures and processes puts constraints on the off-current parameter, because of the large overlap between gate and contact regions.

Thus, if a mid-mobility material such as $\mu$c-Si is to be used in place of a-Si, an alternative structure is needed to address the issue of high off-state current due to field-enhanced carrier generation. Without the capability of suppressing the off-current, an overall increase in the current ON/OFF ratio cannot be realized.

It would be advantageous if a TFT structure could be devised that minimized the electric field influencing the active layer at the contact region. It would be advantageous if the improved TFT had a lower off-current than a conventional top-gate TFT.

SUMMARY OF THE INVENTION

Conventional bottom-gate TFT and top-gate structure are simple to fabricate using well-established process flows. These structures may be optimal for an a-Si active layer because the gate/contact overlap ensures low contact resistance without causing a high off-current. However, these structures are not necessarily optimal when a mid-mobility active layer such as $\mu$c-Si is used. When $\mu$c-Si replaces a-Si as an active layer, the off region of operation of the $\mu$c-Si active layer is influenced by a very large field. The smaller energy gap, higher mobility, and large defect density in the active film result in higher off-current levels. The simplicity of the conventional structure and processes put a constraint on off-current reduction because of the large overlap between gate and contact regions.

To address the above-mentioned problems, a two-gate structure is presented that permits a good contact between the channel and the source/drain (S/D) regions of the contact layer, while reducing the field at contact/gate overlap area. The structure offers independent control of field at the gate/contact overlap for suppressing the off-current, and can be realized without resorting to high resolution photolithography. Independent control of the gate/contact overlap regions is realized by using two gate layers, i.e., main and secondary gates.

Accordingly, a method is provided for forming a bottom-contacted top gate (TG) thin film transistor (TFT) with independent field control for off-current suppression. The method provides a substrate, and forms source and drain regions overlying the substrate, each having a channel interface top surface. A channel is interposed between the source and drain, with source and drain contact regions immediately overlying the source/drain (S/D) interface top surfaces, respectively. A first dielectric layer is formed overlying the source, drain, and channel. A first gate is formed overlying the first dielectric, having a drain sidewall located between the contact regions. A second dielectric layer is formed overlying the first gate and first dielectric. A second gate overlies the second dielectric, located over the drain contact region.

More particularly, the drain region has a channel interface edge, and the first gate drain sidewall is located over the channel, in a range of 0 to 7500 Å from the drain channel interface edge. In some aspects, the second gate is located over the source contact region. In another aspect, the first gate is located over the source contact region.

Additional details of the above-described method and a bottom-contacted TG TFT with independent field control for off-current suppression are provided below.

BRIEF DESCRIPTION OF THE DRAWINGS

FIG. 2 is a partial cross-sectional view of a bottom-contacted top gate (TG) thin film transistor (TFT) with independent field control for off-current suppression.

FIG. 3 is a partial cross-sectional view depicting a first variation of the TG TFT of FIG. 2.

DETAILED DESCRIPTION

Figure 1A:
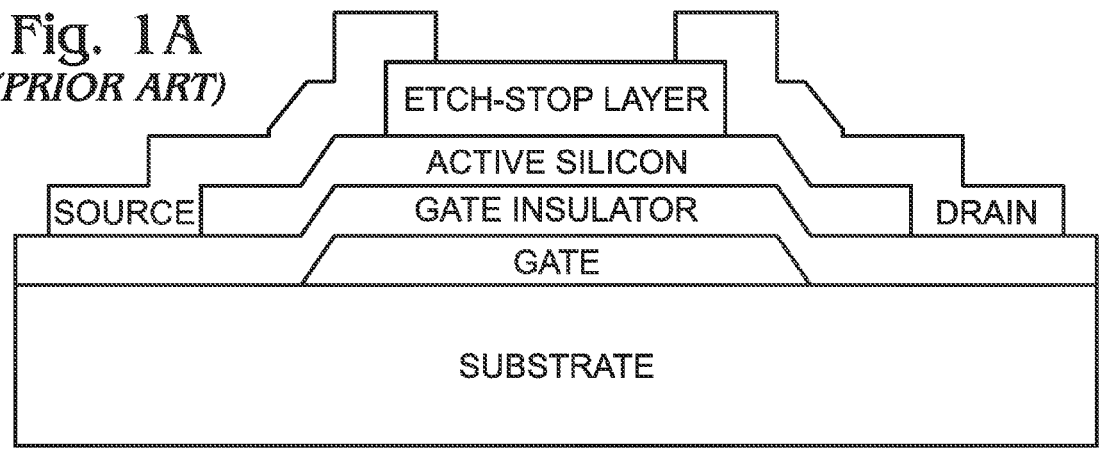
FIGS. 1A and 1B are, respectively, partial cross-sectional views of bottom gate and top gate TFT devices made using an amorphous silicon (Si) active layer (prior art).

FIG. 2 is a partial cross-sectional view of a bottom-contacted top gate (TG) thin film transistor (TFT) with independent field control for off-current suppression. The TFT 200 comprises a substrate 202, which may be a material such as metal foil, Si, glass, plastic, or quartz. However, other unnamed substrate materials may also be used that are well known in the art. A source region 204 and a drain region 206 overlie the substrate 202, each having a channel interface top surface 208a and 208b, respectively. A channel 210 is interposed between the source 204 and drain 206, with a source contact regions 212a and a drain contact 212b immediately overlying the source/drain (S/D) interface top surfaces 208a and 208b, respectively.

In one aspect, the source 204 and drain 206 regions are a first material, and the channel 210 is a second material different than the first material. For example, the source 204 and drain 206 regions may be materials such as a-Si, microcrystalline Si, polysilicon, compound semiconductors, or metal oxide semiconductors. The channel 210 may be materials such as a-Si, microcrystalline Si, polysilicon, compound semiconductors, or metal oxide semiconductors.

A first dielectric layer 214 overlies the source 204, drain 206, and channel 210. A first gate 216 overlies the first dielectric 214, and has a drain sidewall 218 located between the contact regions 212a and 212b. Alternately stated, the first gate immediately overlies and is in contact with the first dielectric 214. Assuming that the channel 210 is a film layer generally oriented in a horizontal plane, the drain sidewall 218 is "located between the contact regions" in the sense that the drain sidewall is tangent to a vertical plane 220 that bisects the channel 210 between contact regions 212a and 212b.

A second dielectric layer 222 overlies the first gate 216 and first dielectric 214. A second gate 224 overlies the second dielectric 222 and is located over the drain contact region 212b. Alternately stated, the second gate 224 immediately overlies and is in contact with the second dielectric 222. Again assuming that the channel 210 is a film layer generally oriented in a horizontal plane, the second gate 224 is "located over the drain contact region" in the sense that a vertical plane 226 passes through both the second gate 224 and the drain contact region 212b.

The first dielectric layer 214 and second dielectric layer 222 may each be a material such as silicon nitride, silicon dioxide, or organic dielectrics. However, other dielectrics are also known in the art. In one aspect, the first and second dielectric layers are different materials. For example, the first dielectric layer 214 may have a thickness 230 of 1000 Å, or less. In other aspects, the first dielectric layer 214 has an interfacial defect density adjacent the channel not exceeding $1 \times 10^{12}$ $(cm^2 eV)^{-1}$.

FIG. 3 is a partial cross-sectional view depicting a first variation of the TG TFT of FIG. 2. As shown, the second gate 224 is located over the source contact region 212a. Again assuming that the channel 210 is a film layer generally oriented in a horizontal plane, the second gate 224 is "located over the source contact region" in the sense that a vertical plane 300 passes through both the second gate 224 and the source contact region 212a.

As shown in FIG. 2, but with equal applicability to FIG. 3, the first gate 216 is located over the source contact region. As above, "located" is defined as being in the same vertical plane. The drain region 206 has a channel interface edge 228. The first gate drain sidewall 218 is located over the channel 210, in a range of 0 to 7500 Å from the drain channel interface edge 228. It should be understood that the above-mentioned range defines the difference between edges in the horizontal plane (left-to-right) as seen in cross-section, not the overall distance between the edges.

Figure 4:
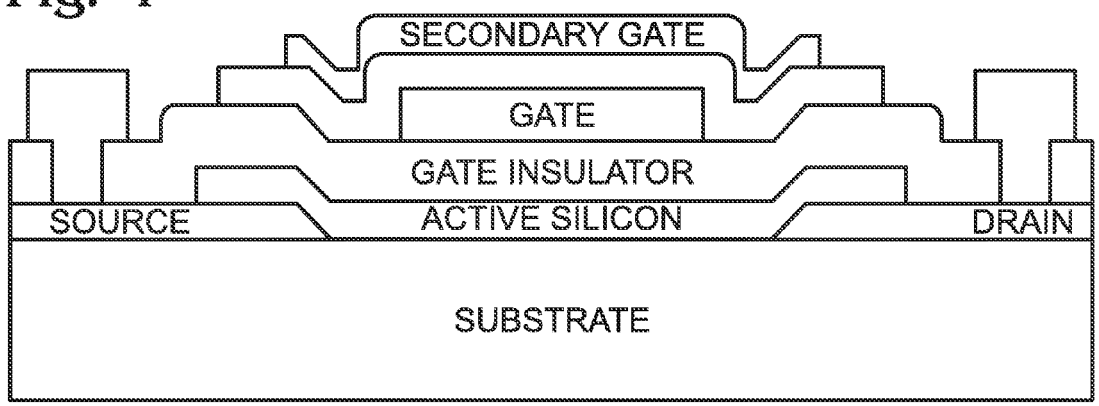
FIG. 4 is a partial cross-sectional view depicting a second variation of the TG TFT of FIG. 2.

FIG. 4 is a partial cross-sectional view depicting a second variation of the TG TFT of FIG. 2. The first (main) gate 214 controls the mid-section of the channel 210 and while second (secondary) gate 224 controls the gate/contact overlap regions.

Figure 5:
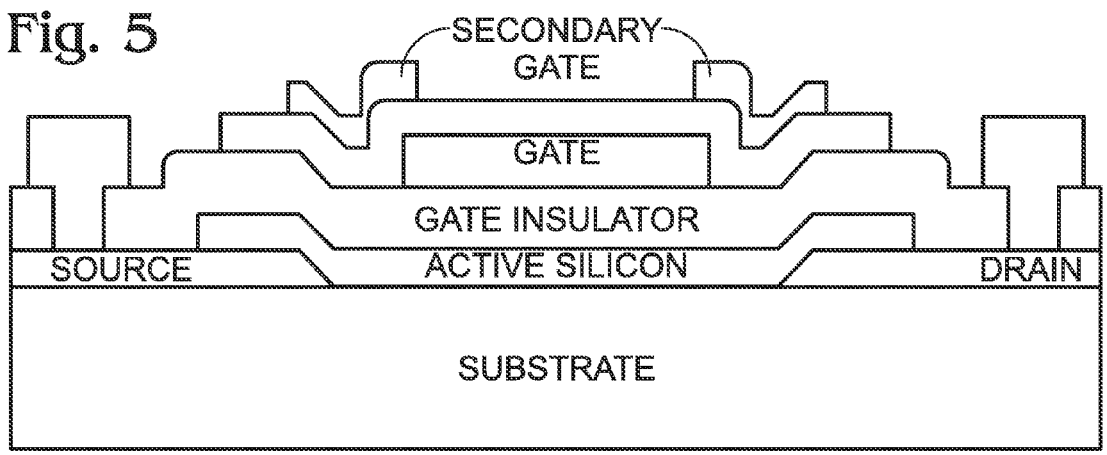
FIG. 5 is a partial cross-sectional view depicting a third variation of the TG TFT of FIG. 2.

FIG. 5 is a partial cross-sectional view depicting a third variation of the TG TFT of FIG. 2. The overlap between second (secondary) gate 224 and the first (main) gate 214 is minimized to decrease parasitic capacitance.

Functional Description

Conventional bottom-gate TFT and top-gate structure are simple to fabricate using well-established process flows. These structures may be optimal for an a-Si active layer because the gate/contact overlap ensures low contact resistance without causing high off-current. However, these structures are not necessarily optimal when a mid-mobility active layer such as μc-Si is used. When μc-Si replaces a-Si as an active layer, the off region of operation of the μc-Si active layer is influenced by a very large field. The smaller energy gap, higher mobility, and large defect density in the active film result in higher off-current levels. The simplicity of conventional structures and processes puts a constraint on off-current reduction because of the large overlap between gate and contact regions.

To address the above-mentioned problems, a two-gate structure is presented in FIGS. 2-5 that permits a good contact between the channel and the S/D regions of the contact layer, while reducing the field at contact/gate overlap area. The structure offers independent control of the field at the gate/contact overlap for suppressing the off-current, and can be realized without resorting to high resolution photolithography. Independent control of the gate/contact overlap regions is realized by using two gate layers, i.e. main (first) and secondary (second) gates.

Figure 6A:
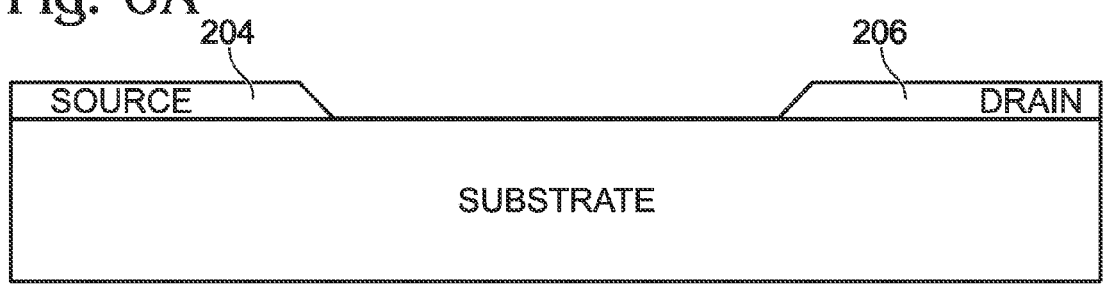
FIGS. 6A through 6F are partial cross-sectional views depicting steps in the fabrication of the device of FIG. 2.

FIGS. 6A through 6F are partial cross-sectional views depicting steps in the fabrication of the device of FIG. 2. The process is compatible with the conventional TFT process technology, so the improved structure can be realized without costly upgrades to an existing production line, ion implantation, or high resolution photolithography. In FIG. 6A, the process starts with a substrate 202 such as a glass wafer. A basecoat layer (not shown) may be deposited to isolate the device from the substrate, to prevent substrate impurities from interfering with the device function. The basecoat layer may be single layer (e.g., 300 nm $SiO_2$) or a stack (e.g., $SiO_2$+SiN). A layer is deposited and patterned to form source/drain regions (e.g., n+ Si layer/metal stack).

Figure 6B:
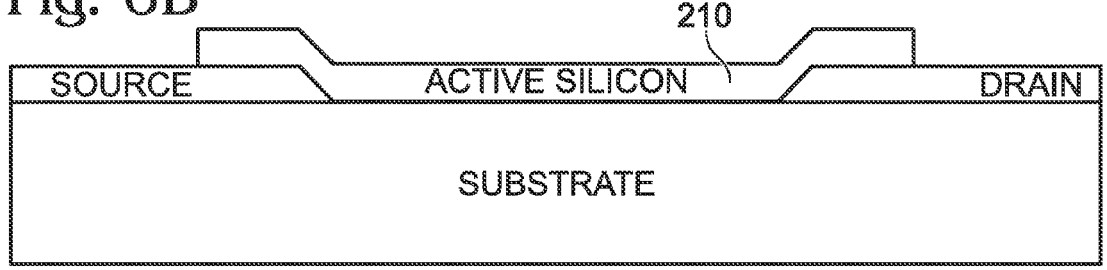

In FIG. 6B, a material such as μc-Si is deposited and patterned to complete the active region and form the channel 210. The Si thickness may be chosen to maximize mobility and minimize off-current. The formation of a good interface to the source/drain region 204/206 and the channel 210 is important.

Figure 6C:
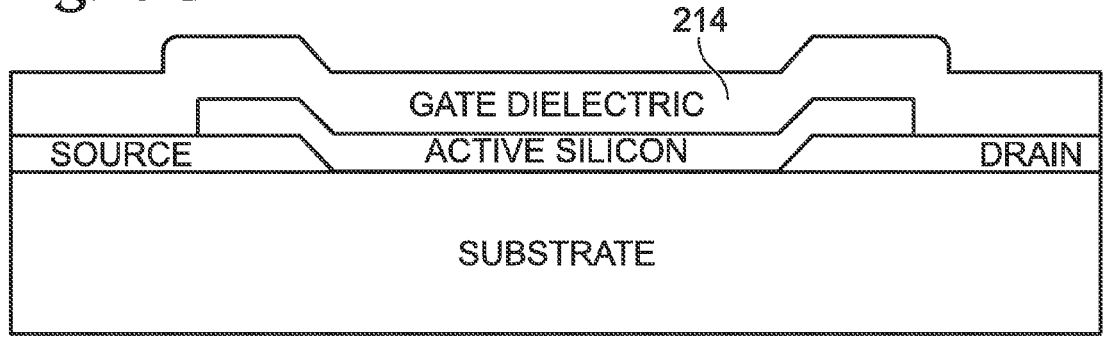

In FIG. 6C, a first gate insulator layer 214 is deposited (e.g., SiN-150 nm, or $SiO_2$-300 nm).

Figure 6D:
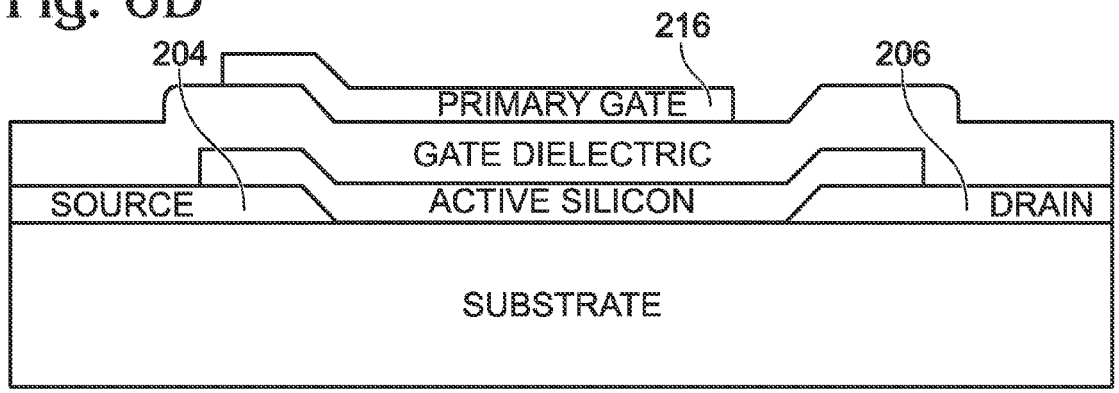

In FIG. 6D the first gate electrode 216 layer is deposited (e.g., metal). The first gate is positioned relative to source/drain regions 204/206, and determines the electric field in between first gate and source/drain electrodes. The metal layer thickness is chosen to optimize step coverage of subsequent layers while maintaining minimal resistance (Rs).

Figure 6E:
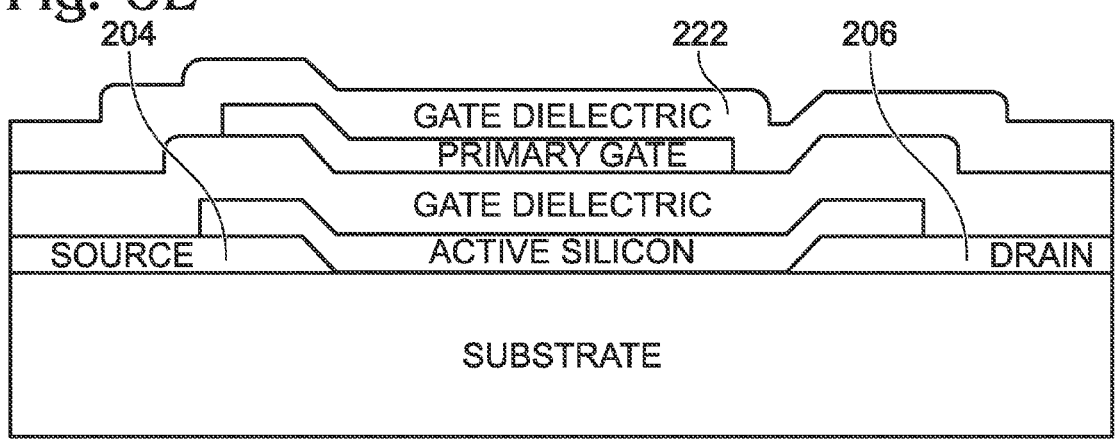

In FIG. 6E, the second layer of gate insulator 222 (e.g. SiN, 150 nm or SiO2, 300 nm) is deposited. The second gate insulator is patterned to define contact holes (not shown) to the source 204 and the drain 206.

Figure 6F:
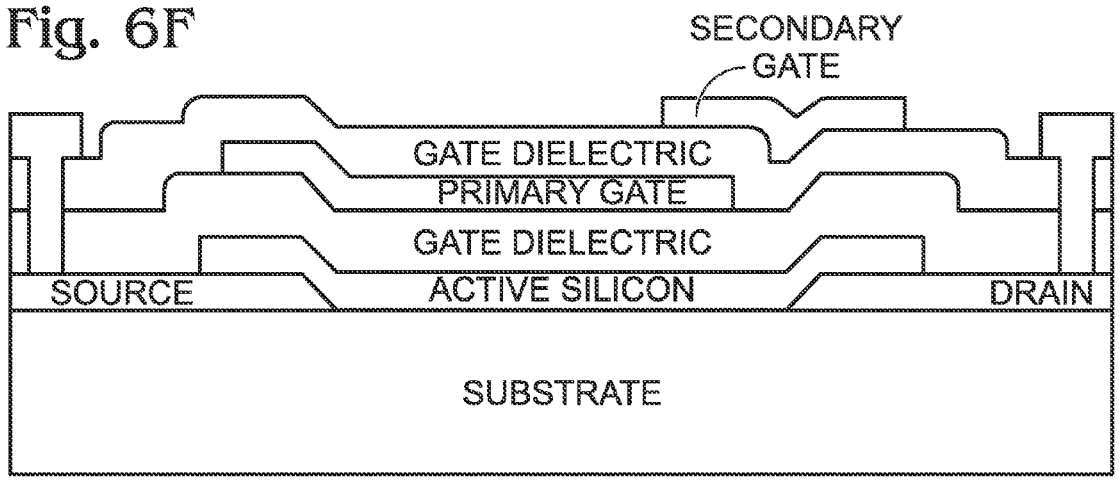

In FIG. 6F, a second layer (e.g., metal) is patterned and deposited for second gate 224. The second gate 224 overlaps the drain region. The process then continues with standard backend process flow for isolation, contacts, and metal interconnect to produce the final device structure. To form source, drain and intrinsic channel regions from the same material, dopant atoms are used. The doping may be performed using either ion implant or diffusion. Both methods require high temperature annealing (700° C. and above). For the implant process, annealing is required to repair disorder caused by high energy atoms penetrating the doped material. For diffusion, annealing is required to diffuse the atoms through the doped material.

For most display applications, the overriding concern is cost. The substrate of choice is glass, which is sensitive to temperatures of greater than 500° C., or even plastic, which is sensitive to temperatures exceeding 300° C. Therefore, high temperature implantation and diffusion processes are not practical. In some aspects, a device can be fabricated from a single μc-Si layer and then implanted with dopant. Instead of thermal annealing, however, a laser annealing process may be used to concentrate thermal energy at the surface of the wafer.

Device simulations were performed using Silvaco process/device simulation software with a physical model for μc-Si material. The simulations took into account band-to-band tunneling which has been identified as primary cause of off-current at large field. At $V_{DS}=2.5V$ and $V_{GS}=-13$, the electric field over the active layer in the overlap region is very high for a conventional device (FIG. 1B), while it is one order of magnitude lower in the case of the present invention (FIG. 2). The key difference is that the second gate is biased independent of the first gate so that the field over the gate/contact overlap region is minimized. In the present invention TG TFT structure, conduction in the channel during the on-state is jointly controlled by the biases of the first gate (VGS) and the second gate (VG2S). Typically, VGS and VG2S would be both at 20V. During the off-state, however, the first gate is at a large negative voltage to deplete the channel, while second gate is at some positive voltage (e.g. 20V) to maintain a low field over the contact region. In the simulation, the potential difference between second gate and drain is VG2S−VDS or, in this case, 20V−2.5V=17.5V, dropped over a 300 nm thick dielectric. In the case of a conventional structure simulation, the potential difference between the gate and the drain is VGS−VDS=−13V−2.5V=−15.5 dropped over only 200 nm thick dielectric.

Figure 1B:
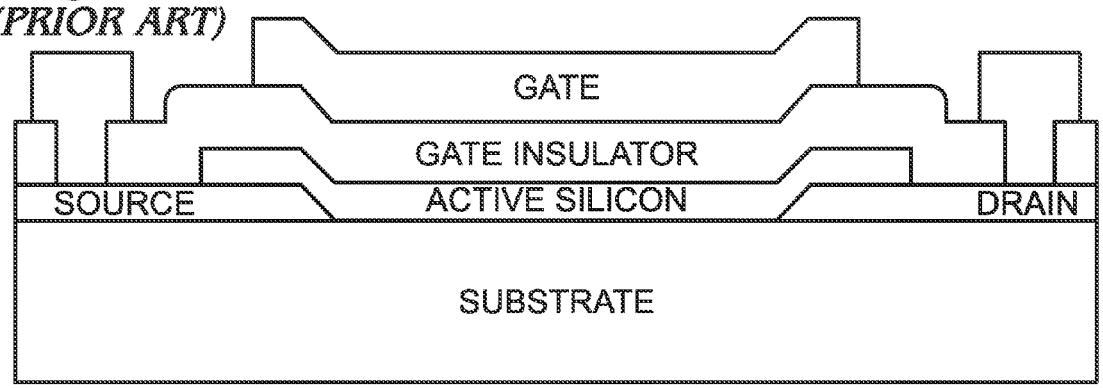
Figure 7:
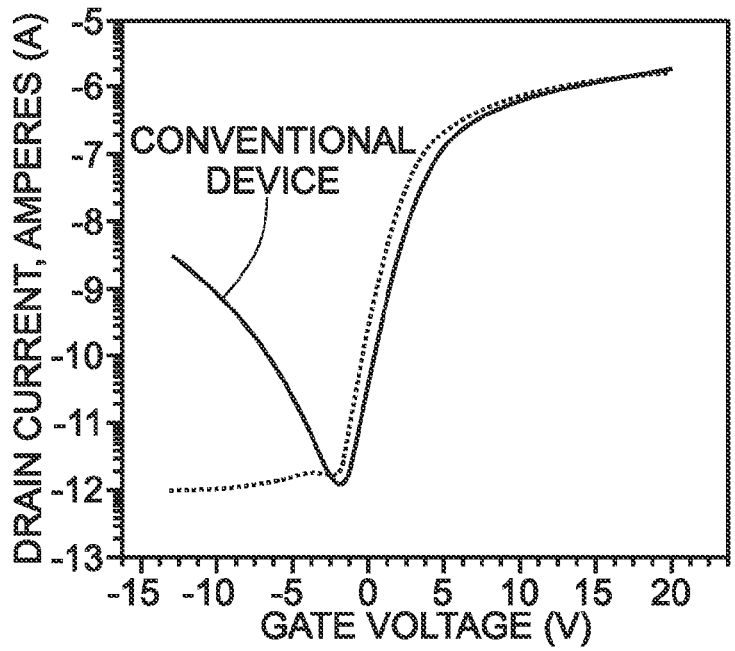
FIG. 7 is a graph depicting IDVG curves contrasting the TG TFT of FIG. 2 with the conventional device of FIG. 1B.

FIG. 7 is a graph depicting IDVG curves contrasting the TG TFT of FIG. 2 with the conventional device of FIG. 1B. At $V_{GS}=13V$ and $V_{G2S}=20V$, the off-current is three orders of magnitude lower for the device of FIG. 2. The second gate bias is held constant at 20V.

Figure 8:
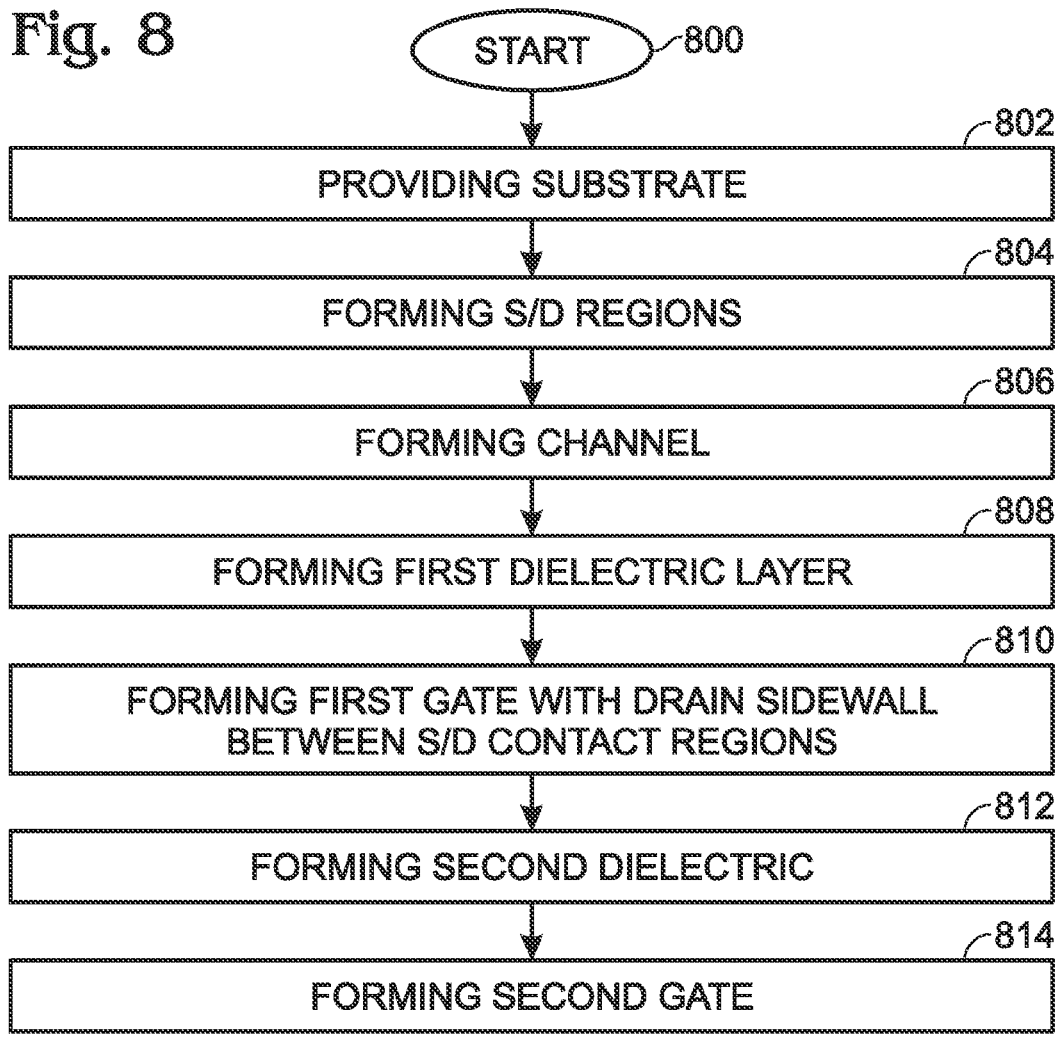
FIG. 8 is a flowchart illustrating a method for forming a bottom-contacted TG TFT with independent field control for off-current suppression.

FIG. 8 is a flowchart illustrating a method for forming a bottom-contacted TG TFT with independent field control for off-current suppression. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 provides a substrate. For example, the substrate may be a material such as metal foil, Si, glass, plastic, or quartz. Step 804 forms source and drain regions overlying the substrate, each having a channel interface top surface. Step 806 forms a channel interposed between the source and drain, with source and drain contact regions immediately overlying the source/drain (S/D) interface top surfaces, respectively.

Step 808 forms a first dielectric layer overlying the source, drain, and channel. Step 810 forms a first gate overlying the first dielectric, having a drain sidewall located between the contact regions. Step 812 forms a second dielectric layer overlying the first gate and first dielectric. Step 814 forms a second gate overlying the second dielectric and located over the drain contact region.

In one aspect, forming the S/D regions in Step 804 includes forming a drain region having a channel interface edge. Then, forming the first gate in Step 810 includes locating the first gate drain sidewall over the channel, in a range of 0 to 7500 Å from the drain channel interface edge. In one aspect, Step 810 locates the first gate over the source contact region. In another aspect, forming the second gate in Step 814 includes locating the second gate over the source contact region.

In a different aspect, forming the first dielectric layer in Step 808 and second dielectric layer in Step 812 includes forming each layer from a material such as silicon nitride, silicon dioxide, and organic dielectrics. The first and second dielectric layers may be made from different materials.

In one aspect, Step 808 forms the first dielectric layer from silicon dioxide, 1000 Å thick or less. In a different aspect, Step 808 forms the first dielectric layer having an interfacial defect density adjacent the channel not exceeding $1\times10^{12}$ $(cm^2\,eV)^{-1}$.

In one aspect, the source and drain regions are formed (Step 804) from a first material, while the channel (Step 806) is formed from a second material different than the first material. Alternately, the first and second materials are the same. The first material may be a-Si, microcrystalline Si, polysilicon, compound semiconductors, or metal oxide semiconductors. The channel region material may be a-Si, microcrystalline Si, polysilicon, compound semiconductors, or metal oxide semiconductors.

A top gate TFT and associated fabrication process, with independent field control for enhanced off-current suppression has been provided. Examples of particular structures details and materials have been provided to illustrate the invention. However, the invention is not limited to merely these examples. Further, the same principles used to form the top gate TFT can be applied to the fabrication of bottom gate TFTs with enhanced off-current suppression. Other variations and embodiments of the invention will occur to those skilled in the art.

We claim:

1. A method for forming a bottom-contacted top gate (TG) thin film transistor (TFT) with independent field control for off-current suppression, the method comprising:
   providing a substrate;
   forming source and drain regions overlying the substrate, each having a channel interface top surface;
   forming a channel interposed between the source and drain, with source and drain contact regions immediately overlying the source/drain (S/D) interface top surfaces, respectively;
   forming a first dielectric layer overlying the source, drain, and channel;
   forming a first gate overlying the first dielectric, having a drain sidewall located between the contact regions;
   forming a second dielectric layer overlying the first gate and first dielectric; and,
   forming a second gate overlying the second dielectric and located over the drain contact region.

2. The method of claim 1 wherein forming the first gate includes locating the first gate over the source contact region.

3. The method of claim 1 wherein forming the S/D regions includes forming a drain region having a channel interface edge; and, wherein forming the first gate includes locating the first gate drain sidewall over the channel, in a range of 0 to 7500 Å from the drain channel interface edge.

4. The method of claim 1 wherein forming the first dielectric layer and second dielectric layer includes forming each layer from a material selected from a group consisting of silicon nitride, silicon dioxide, and organic dielectrics.

5. The method of claim 1 wherein forming the first and second dielectric layers includes forming the first and second dielectric layers from different materials.

6. The method of claim 1 wherein forming the first dielectric layer includes forming a first dielectric layer having a thickness of 1000 Å, or less.

7. The method of claim 1 wherein forming the first dielectric layer includes forming a first dielectric layer having an interfacial defect density adjacent the channel not exceeding $1 \times 10^{12}$ $(cm^2 \, eV)^{-1}$.

8. The method of claim 1 wherein forming the source and drain regions includes forming source and drain regions from a first material; and, wherein forming the channel includes forming the channel from a second material different than the first material.

9. The method of claim 1 wherein forming the source and drain regions includes forming the source and drain from a material selected from the group consisting of a-Si, microcrystalline Si, polysilicon, compound semiconductors, and metal oxide semiconductors; and, wherein forming the channel region includes forming the channel region from a material selected from a group consisting of a-Si, microcrystalline Si, polysilicon, compound semiconductors, and metal oxide semiconductors.

10. A bottom-contacted top gate (TG) thin film transistor (TFT) with independent field control for off-current suppression, the TG TFT comprising:

a substrate;

source and drain regions overlying the substrate, each having a channel interface top surface;

a channel interposed between the source and drain, with source and drain contact regions immediately overlying the source/drain (S/D) interface top surfaces, respectively;

a first dielectric layer overlying the source, drain, and channel;

a first gate overlying the first dielectric, having a drain sidewall located between the contact regions;

a second dielectric layer overlying the first gate and first dielectric; and, a second gate overlying the second dielectric and located over the drain contact region.

11. The TG TFT of claim 10 wherein the first gate is located over the source contact region.

12. The TG TFT of claim 10 wherein the drain region has a channel interface edge; and, wherein the first gate drain sidewall is located over the channel, in a range of 0 to 7500 Å from the drain channel interface edge.

13. The TG TFT of claim 10 wherein the first dielectric layer and second dielectric layer are each a material selected from a group consisting of silicon nitride, silicon dioxide, and organic dielectrics.

14. The TG TFT of claim 10 wherein the first and second dielectric layers are different materials.

15. The TG TFT of claim 10 wherein the first dielectric layer has a thickness of 1000 Å, or less.

16. The TG TFT of claim 10 wherein the first dielectric layer has an interfacial defect density adjacent the channel not exceeding $1 \times 10^{12}$ $(cm^2 \, eV)^{-1}$.

17. The TG TFT of claim 10 wherein the source and drain regions are a first material; and, wherein the channel is a second material different than the first material.

18. The TG TFT of claim 10 wherein the source and drain regions are a material selected from the group consisting of a-Si, microcrystalline Si, polysilicon, compound semiconductors, and metal oxide semiconductors; and, wherein the channel is a material selected from a group consisting of a-Si, microcrystalline Si, polysilicon, compound semiconductors, and metal oxide semiconductors.

* * * * *